(12) United States Patent
Takaishi

(10) Patent No.: US 7,645,653 B2
(45) Date of Patent: Jan. 12, 2010

(54) METHOD FOR MANUFACTURING A SEMICONDUCTOR DEVICE HAVING A POLYMETAL GATE ELECTRODE STRUCTURE

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/844,390

(22) Filed: Aug. 24, 2007

(65) Prior Publication Data

US 2008/0050899 A1  Feb. 28, 2008

(30) Foreign Application Priority Data

Aug. 25, 2006  (JP) .............................. 2006-228670

(51) Int. Cl.
*H01L 21/311* (2006.01)
(52) U.S. Cl. .............................. 438/183; 257/E21.444
(58) Field of Classification Search ............... 438/157, 438/183, 587, 588, 592, 595, 180, 184, 230, 438/283; 257/249, 250, 365, E21.444, E21.453
See application file for complete search history.

(56) References Cited

U.S. PATENT DOCUMENTS

| 6,072,221 | A | 6/2000 | Hieda |
| 6,248,653 | B1 | 6/2001 | Shirahata et al. |
| 6,387,759 | B1 | 5/2002 | Park et al. |
| 6,861,313 | B2 | 3/2005 | Song |
| 7,026,199 | B2 | 4/2006 | Lee |
| 2002/0001935 | A1 | 1/2002 | Kim et al. |
| 2004/0007727 | A1 | 1/2004 | Song |
| 2004/0180535 | A1* | 9/2004 | Elliott et al. ................ 438/629 |
| 2005/0095793 | A1 | 5/2005 | Lee |
| 2006/0084273 | A1* | 4/2006 | Kohyama et al. ........... 438/694 |

FOREIGN PATENT DOCUMENTS

| JP | 11-026757 | 1/1999 |
| JP | 11-340436 | 12/1999 |
| JP | 11/354641 | 12/1999 |
| JP | 2000-183347 | 6/2000 |
| JP | 2001-127288 | 5/2001 |
| JP | 2001-326350 | 11/2001 |
| JP | 2004-040118 | 2/2004 |
| JP | 2005-136376 | 5/2005 |
| JP | 2005-259939 | 9/2005 |

* cited by examiner

*Primary Examiner*—Andy Huynh
*Assistant Examiner*—Suberr Chi
(74) *Attorney, Agent, or Firm*—Young & Thompson

(57) ABSTRACT

A process for manufacturing a semiconductor device having a polymetal structure includes patterning a bottom electrode layer by using a sacrificial layer pattern oxidizing the side surface of the patterned bottom electrode layer, forming a sidewall oxide film on both the patterned bottom electrode layer and the sacrificial layer pattern, removing the sacrificial layer pattern, and forming a top electrode layer on the exposed bottom electrode layer and the side surface of the sidewall oxide film.

13 Claims, 9 Drawing Sheets

61 62 63

65

METHOD FOR MANUFACTURING A SEMICONDUCTOR DEVICE HAVING A POLYMETAL GATE ELECTRODE STRUCTURE

This application is based upon and claims the benefit of priority from Japanese patent application No. 2006-228670, the disclosure of which is incorporated herein in its entirety by reference.

BACKGROUND OF THE INVENTION (a) Field of the Invention

The present invention relates to a method suited for manufacturing a semiconductor device having a polymetal gate electrode structure.

(b) Description of the Related Art

Along with development of finer pattern, higher integration density and higher performance of semiconductor devices, it has become one of the key subjects to reduce the electric resistance of word lines in a DRAM device. A tungsten polycide electrode including a tungsten silicide ($WSi_2$) layer and a polysilicon layer has been generally used as the word lines in the conventional DRAM device. However, in order to further achieve a lower resistance of the word lines, a polymetal electrode including a metallic layer such as made of tungsten (W) and a polysilicon layer is increasingly used instead of the tungsten polycide electrode. The polymetal electrode including a tungsten layer reduces the resistance of the world lines down to ⅓ or less of the resistance of the word lines in the conventional DRAM device. The tungsten polymetal electrode generally includes a thin $WSi_2$ layer and a tungsten nitride (WN) layer between the tungsten layer and the polysilicon layer for suppressing the reaction therebetween and thus reducing the contact resistance. A typical structure of the DRAM device is described in Patent Publication JP-1999-340436A, for example. The structure of the polymetal electrode is described in JP-2001-326350A, for example.

FIG. 7 shows an example of the polymetal electrode structure used for a gate electrode of a MOSFET in a DRAM device. The semiconductor device includes a silicon substrate 70, on which a shallow isolation trench (STI) structure 71 is formed to isolate the surface portion of the silicon substrate 70 into a plurality of device areas or element forming regions. The device areas include an active layer including therein diffused regions, and a gate insulating film formed thereon. A gate electrode formed on the gate insulating film 72 includes a bottom electrode layer 73 made of polysilicon, a top electrode layer 75 made of tungsten/tungsten nitride (W/WN), and a $WSi_2$ layer 74 interposed therebetween for reducing the contact resistance.

A mask oxide film 76 is formed on the top electrode layer 75, the mask oxide film 76 acting as an etching mask during patterning the gate electrode structure and isolating the top electrode layer 75 from an overlying polysilicon pad configuring cell contact 79. A sidewall oxide film 78 is formed on the side surface of the entire gate electrode structure, the sidewall oxide film 78 being used for forming the cell contact 79 in a self-alignment process and isolating the cell contact 79 from the gate electrode structure. Other than the gate electrode structure, there are provided ordinary structures including bit lines 83 attached with mask nitride layer 84 and sidewall nitride film 85, cell capacitors including bottom electrode 89, capacitor insulation film 90 and top electrode 91, capacitor contact plugs 87, interlevel dielectric films 86, 88, 92, and aluminum interconnection lines 93.

Upon forming the gate electrodes in the DRAM device, an oxidization process for oxidizing the side surface of the gate electrodes and top of the diffused regions is performed after the etching step for patterning the gate electrode structure. The sidewall oxide film formed by the oxidation process improves the refreshing characteristic of the DRAM device, and the reliability of the characteristic of the cell transistor. Since tungsten is liable to oxidation, oxidization of the polymetal gate electrode is generally conducted as a WH oxidation under a hydrogen atmosphere. The WH oxidation may involve some problems, however, as will be described hereinafter.

The first problem is that the tungsten disperses during the WH oxidization, and may attach onto the silicon substrate, to degrade the refreshing characteristic of the DRAM device. The second problem is that the tungsten silicide layer interposed between the polysilicon layer and the tungsten layer in the gate electrodes is also oxidized during the WH oxidization to increase the interface resistance. For solving these problems, a protective sidewall film 77 made of silicon nitride is formed on the side surface of the gate electrodes to prevent the dispersion of tungsten and increase of the interface resistance.

Along with development of the finer pattern in the DRAM device, the width of the word lines is also reduced, which emphasizes the importance of small thickness of the protective sidewall film formed on the side surface of the word lines. This is because the width of the word lines increases by double the thickness of the protective sidewall film. Increase of the thickness of the tungsten layer, if employed for compensating a smaller width of the word lines, to reduce the line resistance causes a difficulty in the patterning process for patterning the word lines. Thus, the thickness of the protective sidewall film raises the problem of higher resistance even in the case of using the polymetal structure in the gate electrode.

In addition, the WH oxidation performed in the hydrogen atmosphere or wet atmosphere may cause ingress of oxidation into the interface between the polysilicon layer and the gate insulating film, to thereby form a bird's beak therein. The bird's beak, if formed on both sides of the word lines, may be an isolation film especially in the case of a smaller width of the word lines. This provides an apparent larger thickness of the gate insulting film, to degrade the transistor characteristics. Thus, it is not desirable to provide a larger amount of side oxidation in the WH oxidation, although the larger amount of side oxidation may assure an improved refreshing characteristic of the DRAM device.

SUMMARY OF THE INVENTION

In view of the above problems in the conventional technique, it is an object of the present invention to provide a method suited for manufacturing a semiconductor device, which is capable of reducing the amount of bird's beak in the side oxidation, assuring a larger width and a larger thickness of the top electrode layer without involving a poor refreshing characteristic in a DRAM device having a finer design rule.

The present invention provides a method for manufacturing a semiconductor device including: consecutively depositing a bottom electrode layer and a sacrificial layer on a semiconductor substrate with an intervention of a gate insulating film; patterning the bottom electrode layer and sacrificial layer to form bottom electrode pattern and sacrificial layer pattern; forming a sidewall insulating film on a side surface of both the bottom electrode pattern and the sacrificial layer pattern; removing the sacrificial layer pattern to expose a top surface of the bottom electrode pattern and a side surface of the sidewall insulating film; and forming a top electrode film on the bottom electrode film and the side surface of the sidewall insulating film.

The above and other objects, features and advantages of the present invention will be more apparent from the following description, referring to the accompanying drawings.

PREFERRED EMBODIMENTS OF THE INVENTION

Figure 1:
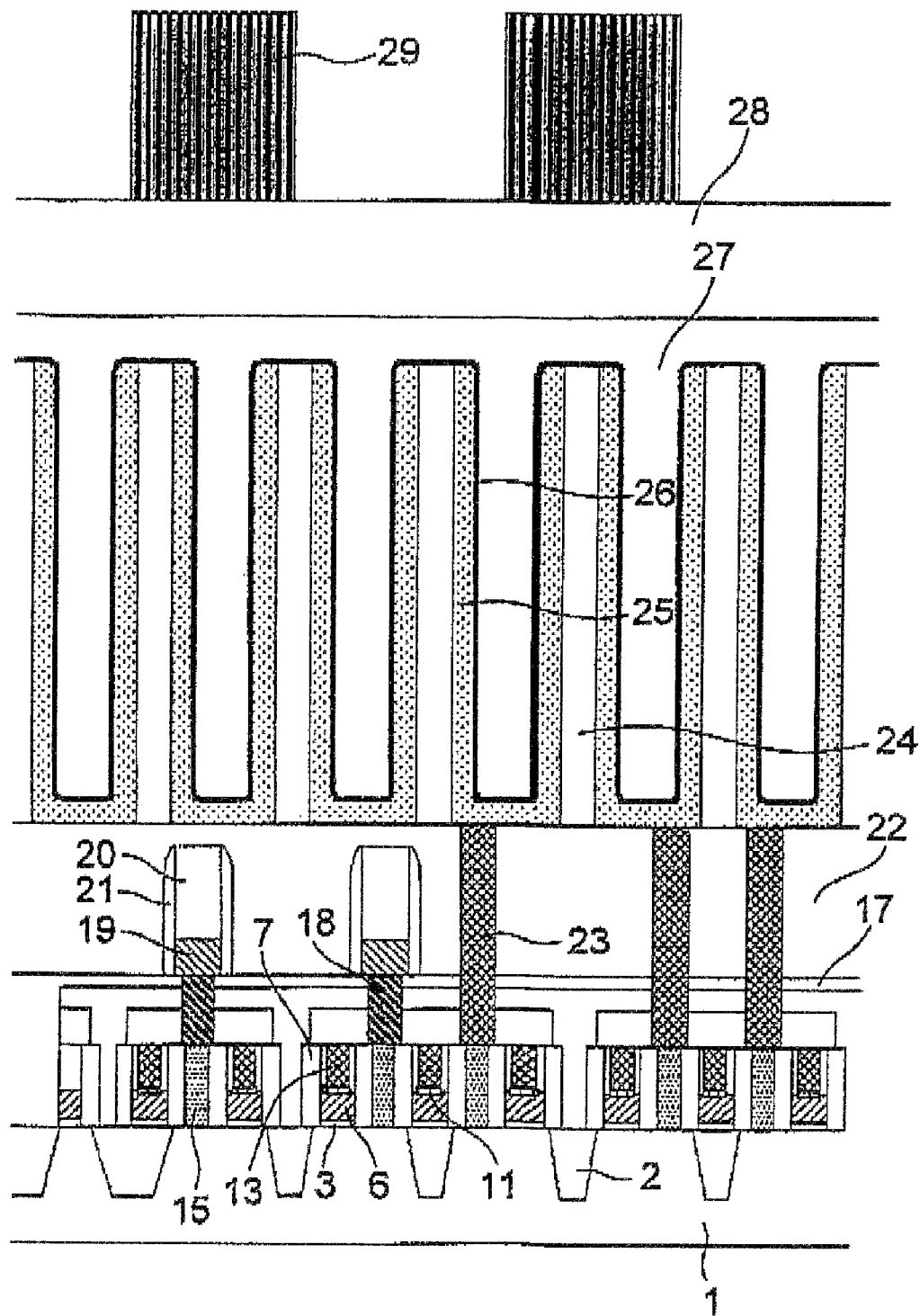
FIG. 1 is a sectional view of a semiconductor device manufactured by a process according to a first embodiment of the present invention.

Now, exemplary embodiments of the present invention will be described with reference to accompanying drawings, wherein similar constituent elements are designated by similar reference numerals.

FIG. 1 shows a semiconductor device manufactured by a process according to a first embodiment of the present invention. The semiconductor device is configured as a DRAM device, and includes a semiconductor substrate 1, and a shallow trench isolation (STI) structure 2 which isolates device areas from one another on the surface portion of the semiconductor substrate 1. The device areas receive an active layer including therein diffused regions (not shown), a gate insulating (oxide) film 3 formed thereon, and a gate electrode formed on the gate insulating film 3 and including a polysilicon bottom electrode layer 6 and a metallic top electrode layer 13 including W/TiN/Ti films. The structure of the gate electrode is formed by a process as described hereinafter A bottom electrode layer 6 and a mask nitride layer to be used as a sacrificial layer are consecutively formed. Thereafter, the side surface of the bottom electrode layer 6 is oxidized for the purpose of improvement in the refreshing characteristic and reliability of the cell transistors. Since the top electrode layer 13 is not formed at this stage, the problems such as an increase in the interface resistance, oxidation or diffusion of the metallic layer and increase in the interface resistance are not incurred by the oxidization. Subsequently, a first sidewall oxide film 7 is formed on the side surface of the bottom electrode layer 6 and the mask nitride layer. Thereafter, polysilicon plugs for bit contacts 18 and capacitor contacts 23, and polysilicon pads for cell contacts 15 are formed. A thermal treatment is then performed at a high temperature for reducing the contact resistance. Since the metallic top electrode layer 13 of the gate electrode is not formed at this stage, the heat treatment does not incur an adverse influence.

Subsequently, the mask nitride layer on the bottom electrode layer 6 is removed, and the top electrode layer 13 is formed on the exposed bottom electrode layer 6. Thereafter, the process uses a variety of heat treatments at a relatively low temperature which does not degrade the top electrode layer 13 made of a metallic material. Since the heat treatment at a high temperature is performed before formation of the metallic top electrode layer 13, a suitable refreshing characteristic is achieved in the DRAM device. The structure shown in FIG. 1 and formed as above provide a DRAM device having a lower resistance of the word lines, superior refreshing characteristic, higher reliability of transistors, etc.

Figure 2A:
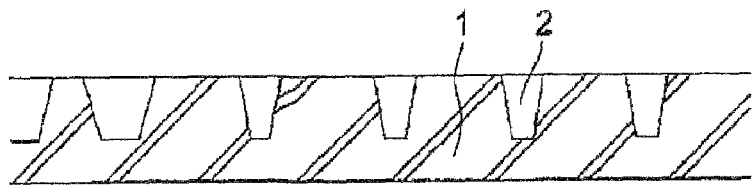
FIGS. 2A to 2Q are sectional views of the semiconductor device in consecutive steps of a process of the first embodiment.
Figure 2B:
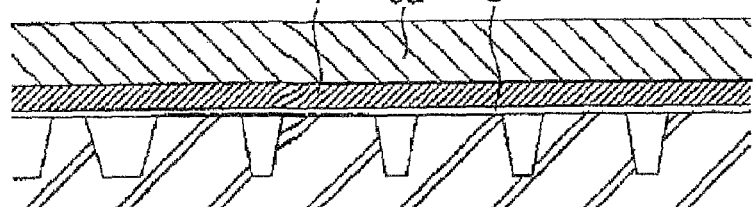

Detail of the overall process for manufacturing the semiconductor device of FIG. 1 will be described hereinafter with reference to FIGS. 2A to 2Q. First, as shown in FIG. 2A, the STI structure 2 is formed on the silicon substrate 1 for isolation of device areas from one another. Subsequently, ion implantation is performed in the device areas such as for forming wells and adjusting the threshold voltage of the transistors. Thereafter, as shown in FIG. 2B, the gate insulating film 3, such as made of silicon oxide or silicon oxynitride, is formed on the active regions, followed by forming a 70-nm-thick polysilicon layer 4 configuring the bottom electrode layer of the gate electrode. Subsequently, a mask silicon nitride layer 5a is deposited on the polysilicon layer 4 to a thickness of about 140 nm, the silicon nitride layer 5a being used later as a sacrificial layer for forming the gate electrode.

Figure 2C:
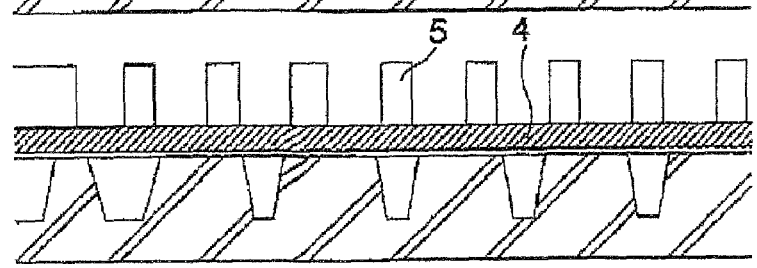
Figure 2D:
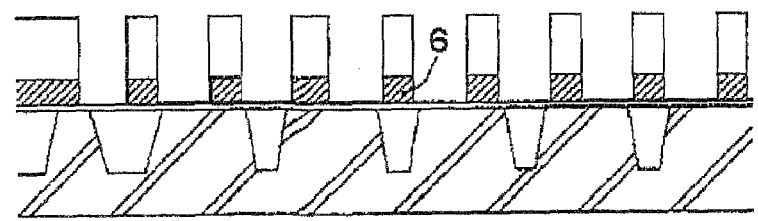

Subsequently, as shown in FIG. 2C, the silicon nitride layer 5 is patterned by using a known photolithographic process to leave a portion of the silicon nitride layer 5a at the location where the word lines are to be formed, thereby forming the mask nitride layer (sacrificial layer pattern) 5. Thereafter, as shown in FIG. 2D, the polysilicon layer 4 is patterned by using the mask nitride layer 5 as an etching mask, to form the bottom electrode layer (pattern) 6. Instead of this process, the silicon nitride film 5a and polysilicon layer 4 may be concurrently patterned using a photoresist mask having a gate electrode pattern.

Oxidization of the side surface of the bottom electrode layer 6 is then performed for improvement of the refreshing characteristic. The conditions for oxidation may be determined without the concerns of oxidization and scattering of metallic electrode film. The oxidation may use hot dry oxidation, which allows a thick sidewall oxide film to be formed while suppressing ingress of the bird's beak into the internal of the gate electrode structure. This side oxidation is especially effective to improve the cell refreshing characteristic and reliability of the cell transistors.

Figure 2E:
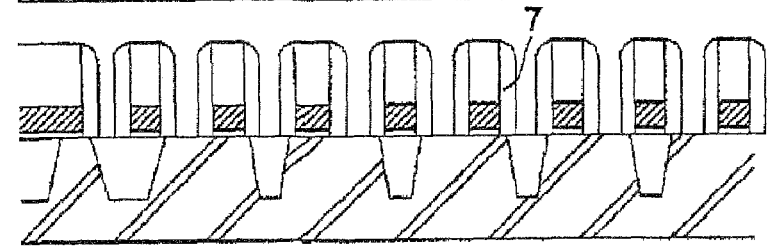
Figure 2F:
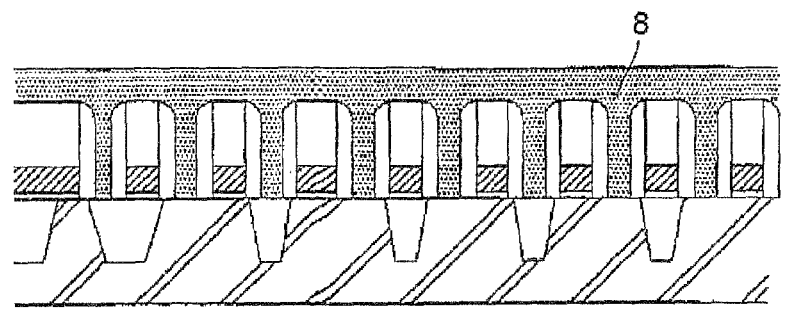
Figure 2G:
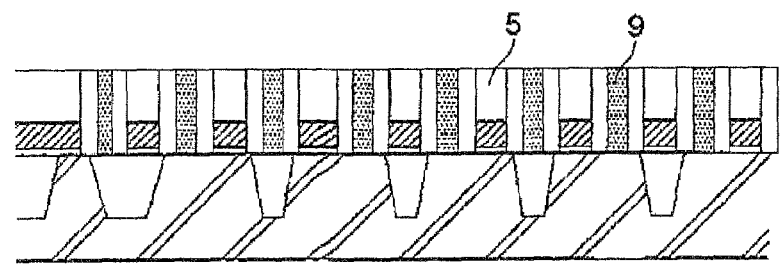

Subsequently, using CVD and etching techniques, as shown in FIG. 2E, the first sidewall oxide film 7 is formed on the side surface of both the bottom electrode layer 6 and mask nitride layer 5. Subsequently, as shown in FIG. 2F, a phosphor-doped polysilicon layer 8 for forming cell contact plugs is deposited on the entire surface to a thickness of about 200 nm. Thereafter, as shown in FIG. 2G, the phosphor-doped polysilicon layer 8 is subjected to planarization using a known CMP technique, whereby a portion of the polysilicon layer 8 on the mask nitride layer 5 is removed to leave polysilicon plugs for cell contacts 9 in the gap between adjacent gate electrodes. Since the metallic top electrode layer is not formed at this stage, a heat treatment at a high temperature may be performed for reducing the contact resistance between the diffused regions and the cell contacts 9 without a problem.

Figure 2H:
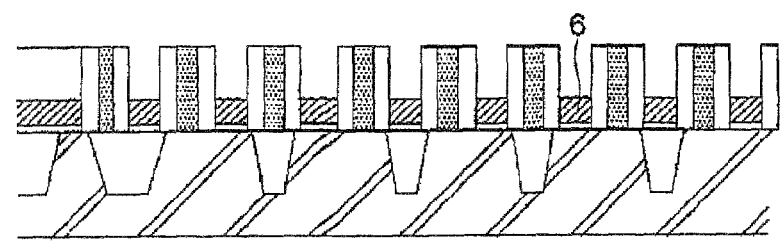

Subsequently, as shown in FIG. 2H, the mask nitride layer 5 is removed to expose the surface of the bottom polysilicon layer 6 and inner side surface of the sidewall nitride film 7.

Figure 2I:
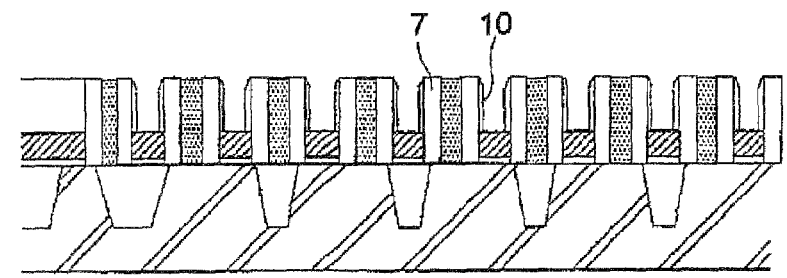
Figure 2J:
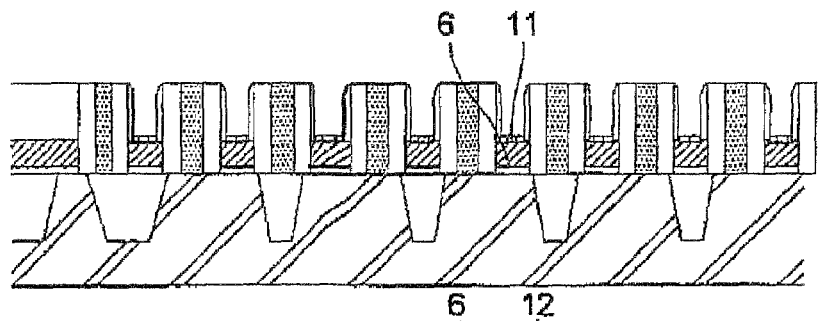

Thereafter, as shown in FIG. 2I, a sidewall oxide film 10 is formed on the inner side surface of the first sidewall oxide film 7, in order to increase the alignment margin between the bit contacts 18 and the top electrode layer 13 to be formed later Subsequently, as shown in FIG. 2J, on the exposed polysilicon bottom electrode layer 6, a known salicide technique is used to form a cobalt silicide layer 11.

Figure 2K:
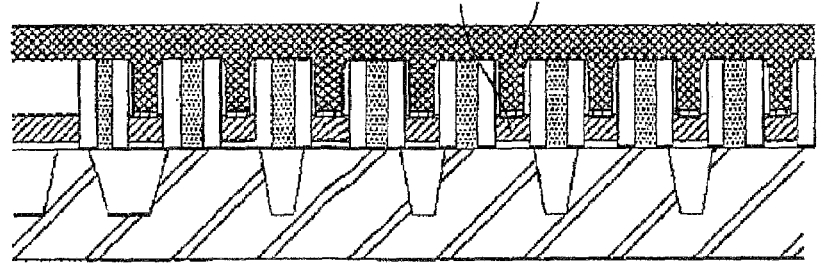
Figure 2L:
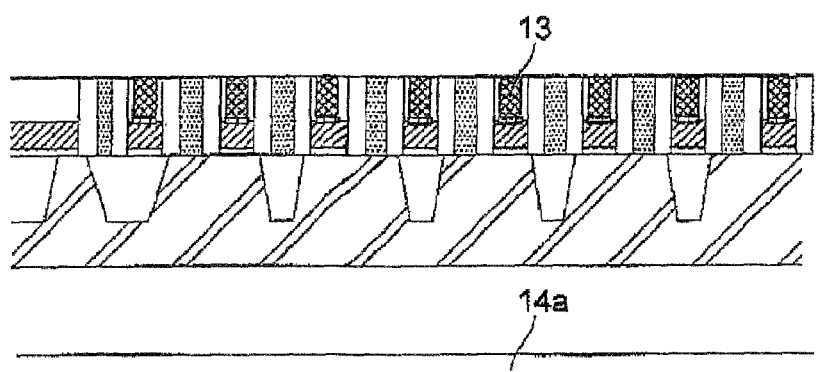

Subsequently, as shown in FIG. 2K, the layer structure 12 of the top electrode layer including W/TiN/Ti films is deposited on the entire surface. Thereafter, as shown in FIG. 2L, the layer structure 12 of W/TiN/Ti films is subjected to a CMP process to leave a portion of the layer structure received in the groove formed by removal of the mask nitride layer, thereby obtaining the top electrode layer 13. That is, the gate polymetal electrode structure including the bottom electrode layer 6 and top electrode layer 13 is formed.

The thickness of the top electrode layer 13 is determined by the thickness of the mask nitride layer 5. Since the metallic layers configuring the top electrode layer 13 are not etched for patterning, and the mask nitride layer 5 is etched instead, the top electrode layer 13 may have a larger thickness without causing a difficulty in the etching process. The side oxidization and high-temperature heat treatment can be performed without incurring oxidation and dispersion of the metallic layer. A lower-temperature heat treatment after forming the metallic layers prevents a higher electric resistance of the polymetal gate electrode.

Figure 2M:
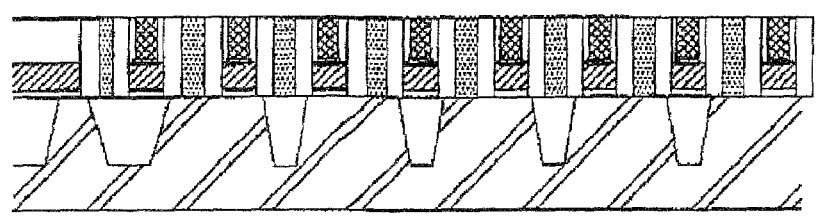
Figure 2N:
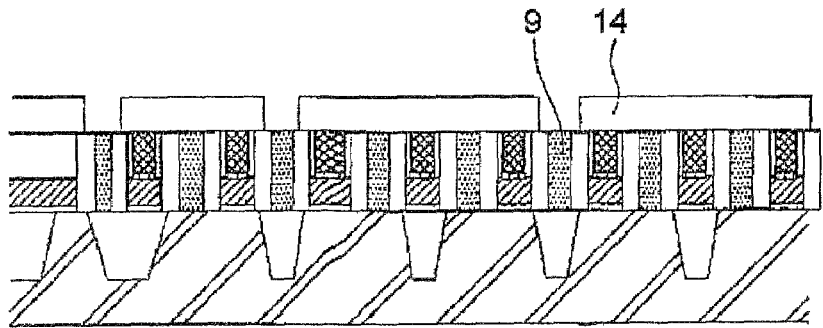
Figure 3:
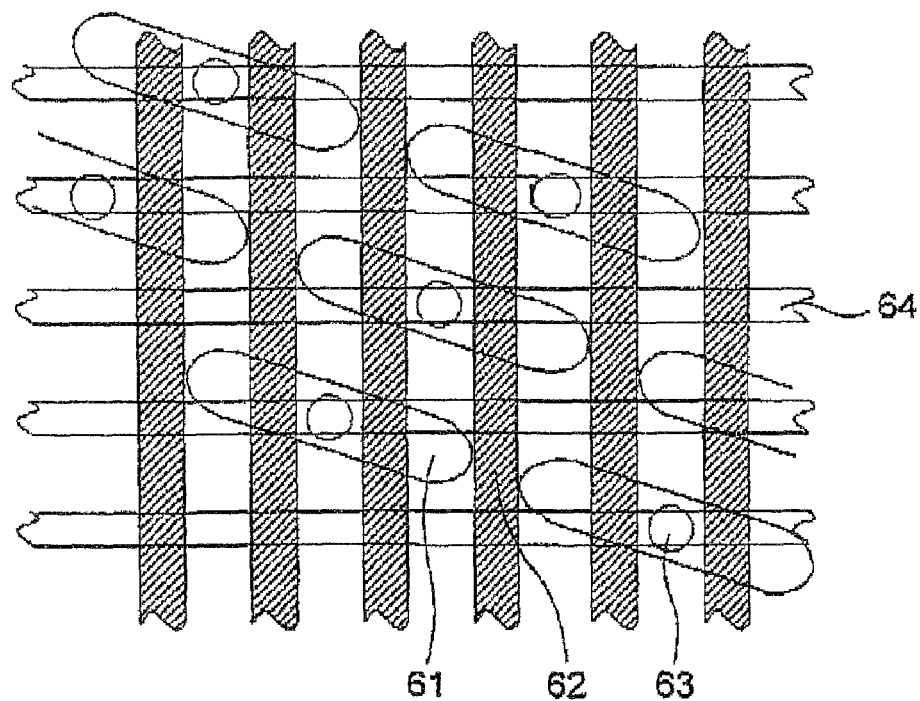
FIG. 3 is a top plan view of the semiconductor device in a step of the process of the first embodiment.

Subsequently, a silicon oxide film 14a for forming therefrom an oxidization mask, which is to be used in forming the polysilicon pad, is deposited, as shown in FIG. 2M. Thereafter, as shown in FIG. 2N, using a known photolithographic process, a resist pattern is formed, and the silicon oxide film 14a is etched using the resist pattern as an etching masks to form the mask oxide film 14. The plane layout at this stage is shown in FIG. 3. As understood from FIG. 3, the gate electrodes 62 overlying the diffused regions 61 extend parallel to one another. Bit contacts 63 are disposed at the center of the diffused regions 61. Bit lines 64 in contact with the top of bit contacts extend parallel to one another and perpendicular to the gate electrodes 62.

Figure 4:
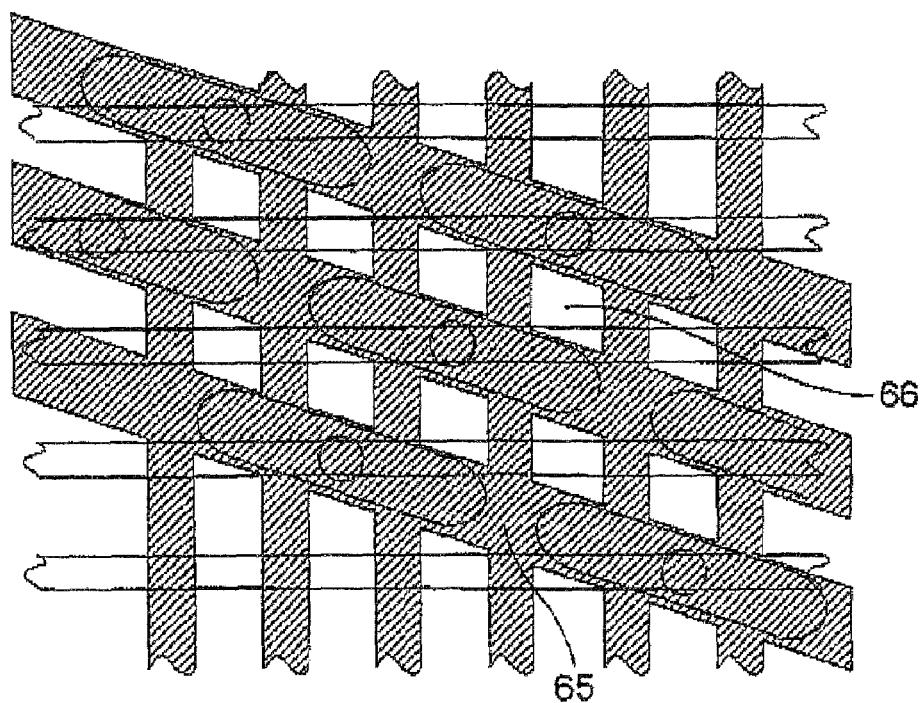
FIG. 4 is a top plan view of a mask used in the step of FIG. 3.

FIG. 4 shows the pattern of the oxide mask 65 formed in order to achieve the arrangement of FIG. 3. The oxide mask 65 has therein openings on the STI structure 66 from which the polysilicon plugs 9 are to be removed. That is, a portion of the polysilicon layer on the STI structure 66 is removed, and polysilicon plugs for the cell contacts are formed within the gap between adjacent gate electrodes 62 overlying the diffused regions 61.

Figure 2O:
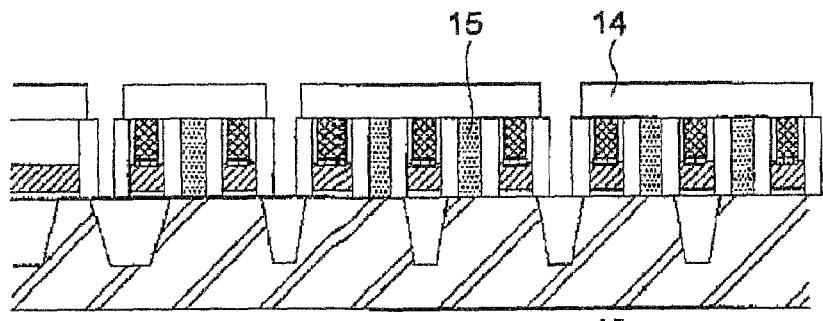
Figure 2P:
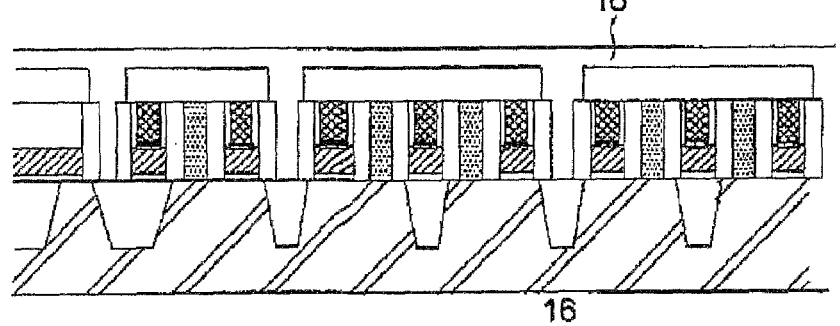
Figure 2Q:
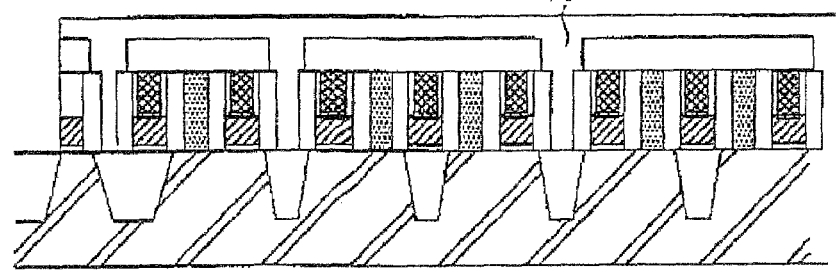

Subsequently, as shown in FIG. 2O, the mask oxide film 14 is used as an etching mask to selectively remove the polysilicon plugs 9 on the STI structure 2, leaving polysilicon pads 15 for the cell contacts. Thereafter, as shown in FIG. 2P, a first interlayer dielectric film 16 is deposited on the entire surface to have a flat surface thereof in the cell array area. Thereafter, the structure of transistors including the gate electrodes etc. are formed in the peripheral circuit area as by etching the first interlayer dielectric film 16, as shown in FIG. 2Q.

Subsequently, as shown in FIG. 1, a second interlayer insulation film 17 is deposited in the peripheral circuit area and memory cell array area, followed by forming bit contacts 18, interconnect lines including bit lines 19, mask nitride layer 20 and sidewall protective film 21, a third interlevel dielectric film 22, capacitor contacts 23, cylinder core oxide film 24, cell capacitors including capacitor bottom electrodes 25, capacitor insulation film 26 and capacitor top electrode 27, a fourth interlevel dielectric film 28, and aluminum interconnect lines 29, whereby the structure of the DRAM device shown FIG. 1 is obtained.

The method of the first embodiment for manufacturing the DRAM device uses a process separately forming the bottom electrode layer 6 and top electrode layer 13 for the gate electrode. Thus, the heat treatment performed to the bottom electrode layer 6 at a high temperature for the purpose of reducing the contact resistance, or the side oxidation of the bottom electrode layer performed for the purpose of improving the refreshing characteristic of the DRAM device and transistor characteristics does not degrade the polymetal gate structure, and thus does not affect the performance of the DRAM device.

Figure 5A:
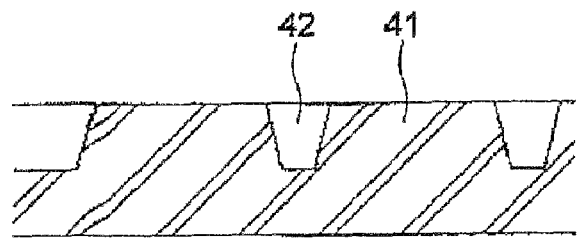
FIGS. 5A to 5E are sectional views of a semiconductor device in consecutive steps of a process according to a second embodiment of the present invention, taken along line perpendicular to the extending direction of the gate electrode.
Figure 5B:
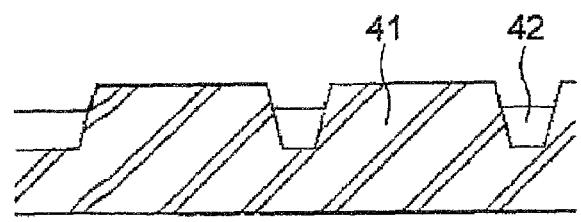
Figure 5C:
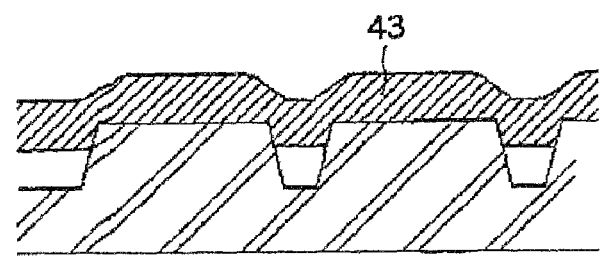
Figure 5D:
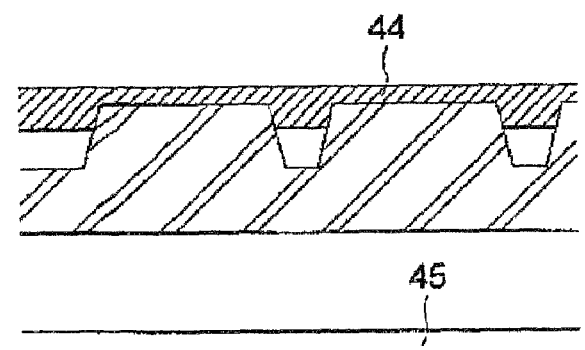
Figure 5E:
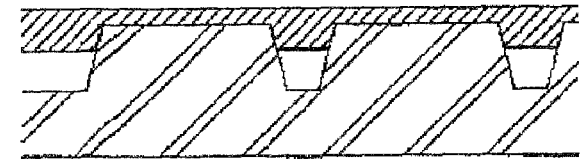
Figure 6A:
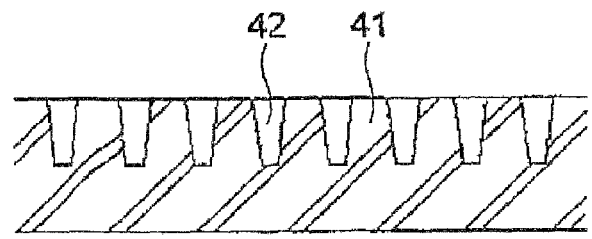
FIGS. 6A to 6E are sectional views of a semiconductor device in consecutive steps of a process according to a second embodiment of the present invention, taken along line parallel to the extending direction of the gate electrode.

A method for forming a semiconductor device according to a second embodiment of the present invention will be described hereinafter with reference to FIGS. 5A to 5E and FIGS. 6A to 6E. FIGS. 5A to 5E show the gate structure in a sectional view taken along the direction perpendicular to the extending direction of the gate electrode, whereas FIGS. 6A to 6E show the same gate electrode structure in a sectional view taken in the direction along the extending direction of the gate electrode. FIGS. 5A and 6A show the semiconductor device at the stage after the step of forming the STI structure 42 on the silicon substrate 41 to isolate device areas, which include therein diffused regions (not shown) of the transistor.

Figure 6B:
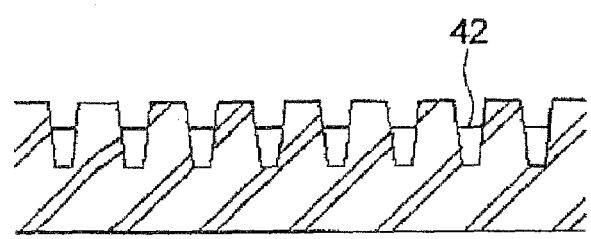

The process for forming the STI structure 42 includes the step of forming a trench on the surface of the silicon substrate 41, and embedding an oxide film within the trench. The top portion of the oxide film in the STI structure 42 is then removed, as shown in FIGS. 5B and 6B, thereby exposing diffused regions at the top portion of the side surface of the trench of the STI structure 42. In short, the diffused regions of the resultant transistors have a three-dimensional structure.

Figure 6C:
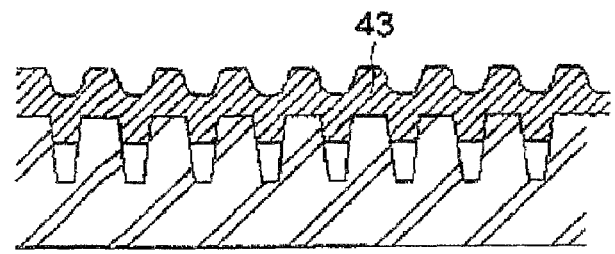
Figure 6D:
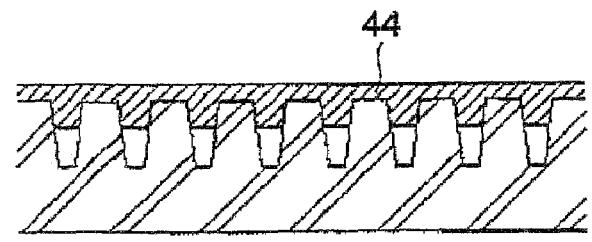
Figure 6E:
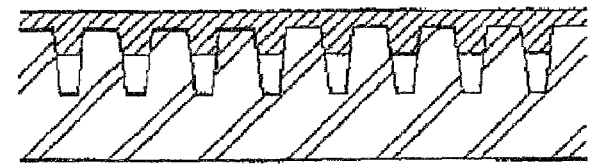
Figure 7:
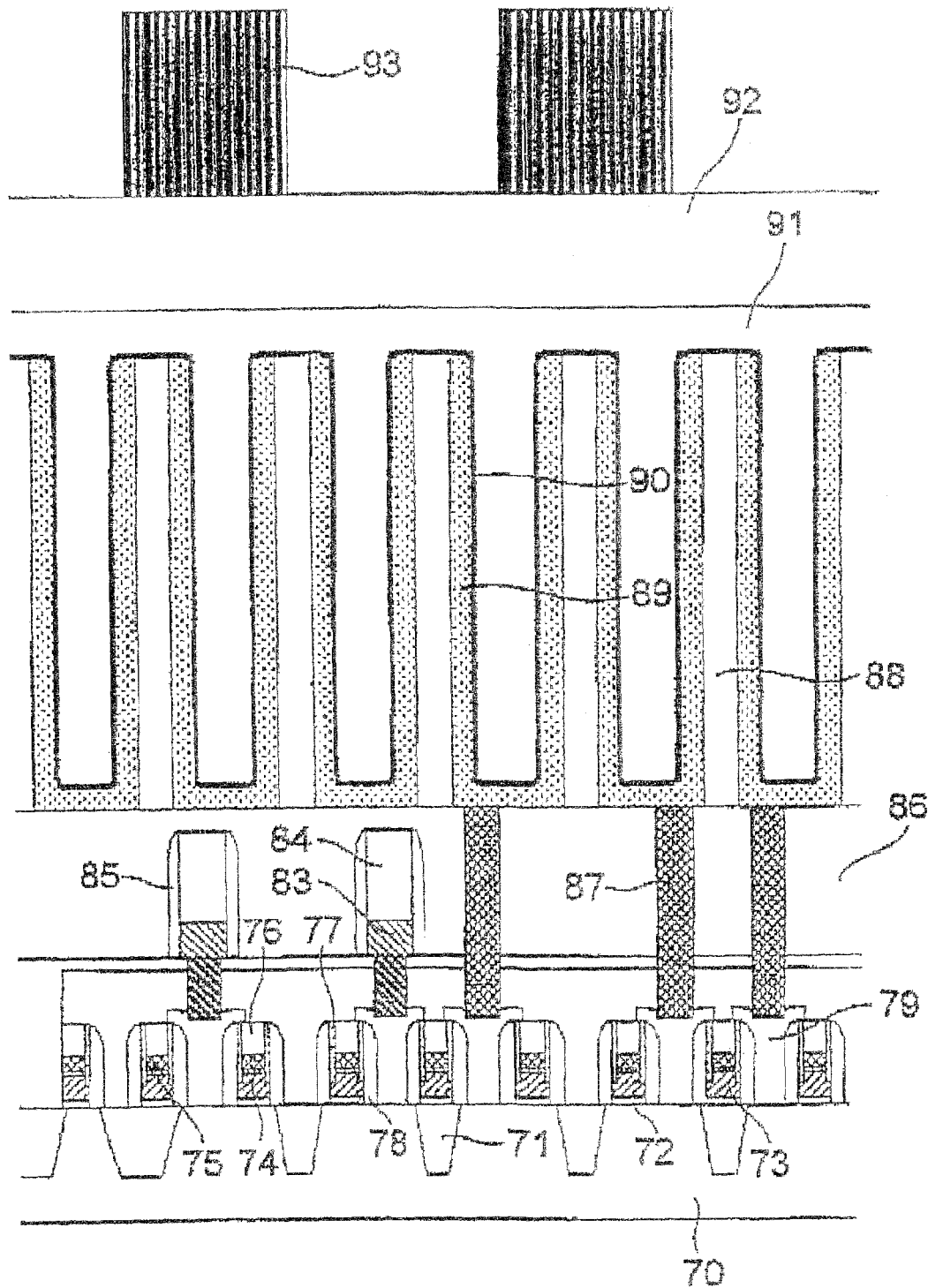
FIG. 7 is a sectional view of a conventional DRAM device.

The three-dimensional diffused regions are then subjected to channel ion-implantation for forming channels of transistors therein, followed by forming thereon a gate insulating film (not shown). Subsequently, as shown in FIGS. 5C and 6C, a polysilicon layer 43 is deposited on the entire surface including the three-dimensional diffused regions. The polysilicon layer 43 has an uneven top surface reflecting the underlying uneven structure of the three-dimensional diffused regions. Thereafter, as shown in FIGS. 5D and 6D, the polysilicon layer 43 is subjected to a CMP process to form the bottom electrode layer 44 having a flat top surface. A silicon nitride film 45 is then deposited on the bottom electrode layer 44, as shown in FIGS. 5E and 6E. The structure shown in FIGS. 5E and 6E is roughly equivalent to the structure shown in FIG. 2B of the first embodiment. The process of the second embodiment then uses processes similar to the processes shown in FIGS. 2C to 2Q, to complete a DRAM device including diffused regions known as fin-type diffused regions having a three-dimensional structure.

In the process for manufacturing the DRAM device according to the second embodiment, the bottom polysilicon layer is subjected to a CMP process for planarization after deposition of the same onto the three-dimensional diffused regions This planarization process provides a superior top surface of the bottom electrode layer, which in turn allows the metallic top electrode layer to have a superior structure The transistors including the three-dimensional diffused regions generally have the advantage of a larger ON current. In addition, since the electric field formed by the gate electrode is directed in three directions, the resultant transistors have a less dependency of the ON current on the substrate bias and thus have an improved S-value and improved performance.

It is to be noted that although the top electrode layer includes a tungsten film in the above embodiments, the tungsten film may be replaced by or combined with another metallic film having a low-resistivity, such as a titanium film. Although the DRAM device is exemplified as the semiconductor device, the semiconductor device in the present invention may be other than the DRAM device so long as the gate electrode therein has a polymetal structure. The sacrificial layer need not be a silicon nitride film or an insulating film so long as it can be selectively removed from the bottom electrode layer. The top electrode layer and bottom electrode layer need not be a metallic layer and a polysilicon layer, respectively.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A method for manufacturing a semiconductor device comprising in order:
    consecutively depositing a bottom electrode layer and a sacrificial layer on a semiconductor substrate with an intervention of a gate insulating film;
    patterning said bottom electrode layer and sacrificial layer to form bottom electrode pattern and sacrificial layer pattern;
    forming a sidewall insulating film on a side surface of both said bottom electrode pattern and said sacrificial layer pattern;
    forming contact plugs on said semiconductor substrate in self-alignment with said sidewall insulating film; and
    heat treating said contact plugs to reduce a contact resistance between said contact plugs and said semiconductor substrate;
    removing said sacrificial layer pattern to expose a top surface of said bottom electrode pattern and a side surface of said sidewall insulating film; and
    forming a top electrode film on said bottom electrode film and said side surface of said sidewall insulating film.

2. The method according to claim 1, further comprising between said patterning and said forming said sidewall insulating film:
    oxidizing a side surface of said bottom electrode film.

3. The method according to claim 1, further comprising subsequent to said forming said top electrode:
    removing some of said contact plugs by using a mask.

4. The method according to claim 1, wherein said bottom electrode layer includes polysilicon.

5. The method according to claim 4, wherein said top electrode layer includes at least one of tungsten and titanium.

6. The method according to claim 1, further comprising prior to said depositing:
    forming a trench on said semiconductor substrate;
    embedding an insulating film in said trench; and
    removing a top portion of said insulating film within said trench.

7. The method according to claim 6, wherein said depositing step comprises flattening a top surface of said bottom electrode layer.

8. The method according to claim 1, wherein the first insulating layer is silicon nitride, and the sidewall insulating film is silicon oxide.

9. A method for manufacturing a semiconductor device comprising in order:
    forming first and second structures overlying a substrate, wherein the first and second structures are apart from each other to form a gap structure, and each of the first and second structures has a first conductive layer and a first insulating layer on the first conductive layer;
    forming a sidewall insulating film on each of side surfaces of the first and second structures;
    filling the gap structure with a third conductive layer;
    removing the first insulating layers of each of the first and second structures to expose top surfaces of the first conductive layers of each of the first and second structures; and
    forming a second conductive layer on the first conductive layer of each of the first and second structures.

10. The method according to claim 9, wherein said forming the second conductive layer comprises covering the first and third conductive layers with a conductive material layer, and performing planarization process on the conductive material layer to divide the conductive material layer into the second conductive layer on the first conductive layer of each of the first and second structures and to expose a surface of the third conductive layer.

11. The method according to claim 10, further comprising:
    forming a second insulating layer over the second and third conductive layers; and
    forming a contact plug selectively in the second insulating layer in contact with the third conductive layer.

12. A method for manufacturing a semiconductor device comprising in order:
    forming first and second structures over a substrate, wherein the first and second structures are apart from each other to form a gap, and each of the first and second structures has a first conductive layer and a first insulating layer on the first conductive layer;
    forming a sidewall insulating film on each of side surfaces of the first and second structures;
    forming a third conductive layer on the first insulating layer and the sidewall insulating film to cover the gap;
    performing a planarization process on the third conductive layer to leave the third conductive layer in the gap and to expose a top surface of the first insulating layer;
    removing the first insulating layers of each of the first and second structures to expose top surfaces of the first conductive layers of each of the first and second structures;
    forming a second conductive layer on the first conductive layer of each of the first and second structures; and
    removing a part of the third conductive layer by using a mask and an etching process to make contact plugs.

13. The method according to claim 12, wherein forming the second conductive layer comprises covering the first and third conductive layer with a conductive material layer, and performing another planarization process on the conductive material layer to divide the conductive material layer into the second conductive layer on the first conductive layer of each of the first and second structures and to expose a surface of the third conductive layer.

* * * * *